(12) United States Patent
Shibuya

(10) Patent No.: US 7,548,078 B2
(45) Date of Patent: Jun. 16, 2009

(54) PERFORMANCE BOARD FOR ELECTRONICALLY CONNECTING A DEVICE UNDER TEST WITH A TEST APPARATUS FOR TESTING A DEVICE UNDER TEST

(75) Inventor: Atsunori Shibuya, Saitama (JP)

(73) Assignee: Advantest Corporation, Tokyo (JP)

( * ) Notice: Subject to any disclaimer, the term of this patent is extended or adjusted under 35 U.S.C. 154(b) by 212 days.

(21) Appl. No.: 11/393,314

(22) Filed: Mar. 30, 2006

(65) Prior Publication Data
US 2007/0069758 A1   Mar. 29, 2007

(30) Foreign Application Priority Data
Sep. 27, 2005   (JP)   ............................. 2005-280026

(51) Int. Cl.
*G01R 31/26* (2006.01)
(52) U.S. Cl. ...................... 324/755; 324/754; 324/765
(58) Field of Classification Search ....................... None
See application file for complete search history.

(56) References Cited

U.S. PATENT DOCUMENTS

| | | | | |
|---|---|---|---|---|
| 5,747,994 A | * | 5/1998 | Suga | ........................ 324/158.1 |
| 5,757,201 A | * | 5/1998 | Partridge et al. | ............. 324/755 |
| 6,625,557 B1 | * | 9/2003 | Perkins et al. | ............... 702/117 |
| 2007/0001702 A1 | * | 1/2007 | Takasu et al. | ................ 324/765 |

FOREIGN PATENT DOCUMENTS

JP   2004-108898   4/2004

OTHER PUBLICATIONS

Patent Abstracts of Japan, Publication No. 2004-108898, Publication Date: Apr. 8, 2004, 1 page.

* cited by examiner

*Primary Examiner*—Vinh P Nguyen
(74) *Attorney, Agent, or Firm*—Osha • Liang LLP

(57) ABSTRACT

There is provided a test apparatus having a test head containing test modules for sending/receiving signals to/from a device-under-test, a device mounting section having a socket for mounting the device-under-test and a performance board placed on the test head to connect each terminal of the test module with each terminal of the device-under-test via the device mounting section, and the performance board has a plurality of sub-boards each containing a part of a plurality of wires for connecting the test module with the device-under-test and a fixing section for attaching and fixing the plurality of sub-boards in a body to the test head.

8 Claims, 16 Drawing Sheets

PERFORMANCE BOARD FOR ELECTRONICALLY CONNECTING A DEVICE UNDER TEST WITH A TEST APPARATUS FOR TESTING A DEVICE UNDER TEST

CROSS REFERENCE TO RELATED APPLICATION

The present application claims priority from a Japanese Patent Application(s) No. 2005-280026 filed on Sep. 27, 2005, The contents of which are incorporated herein by reference.

BACKGROUND OF THE INVENTION

1. Field of the Invention

The present invention relates to a performance board, a test apparatus, a test method, a diagnosis board and a diagnosis method. More specifically, the invention relates to a performance board for the use of a test apparatus for testing semiconductor devices and the like, the test apparatus and a test method for testing the semiconductor devices and the like and a diagnosis board and a diagnosis method for diagnosing the test apparatus.

2. Related Art

A test apparatus for testing a semiconductor device has a test head containing a plurality of test modules for supplying a test signal to the semiconductor device to be tested and a performance board for properly connecting the respective test modules with respective terminals of the semiconductor device. The test apparatus tests the semiconductor device by setting the performance board on which the semiconductor device is loaded on the test head (see Japanese Patent Laid-Open No. 2004-108898 for example).

The test head has a plurality of slots for attaching the test modules and incorporates the test modules therein as they are attached to the slots. In the conventional test apparatus, each slot within the test head has been correlated with a certain type of test module to be incorporated in advance and its degree of freedom has been low.

Lately, there has been proposed a test apparatus adopting an open-architecture method. The test apparatus adopting the open-architecture method allows the test module to be attached to any slot regardless of type thereof and disposition of the test module in the test head to be freely rearranged.

When the test modules are incorporated in the test head, the test apparatus diagnoses whether or not each test module properly operates. The test apparatus diagnoses the test modules by placing a diagnosis board on the test head, instead of the performance board.

By the way, the performance board had to be made per arrangement of the test modules in each time in rearranging the disposition of the test modules in the test head. Thereby, it has been costly.

Still more, circuits and wires on the performance board in the test apparatus for simultaneously measuring a plurality of semiconductor devices is divided into regions per semiconductor device to be simultaneously measured. For example, a test apparatus for simultaneously measuring four semiconductor devices has four wires formed on the performance board.

A diagnosis board for use in diagnosis is also normally divided into regions per semiconductor device to be simultaneously measured in correspondence to the performance board. Therefore, the diagnosis board has the same size with the corresponding performance board. However, the diagnosis board can normally diagnose all test modules if a diagnosing circuit corresponding to one semiconductor device is constructed. It thus causes an excess space, increasing the cost.

SUMMARY OF THE INVENTION

Accordingly, it is an object of the invention to provide a performance board, a test apparatus, a test method, a diagnosis board and diagnosis method, which are capable of solving the above-mentioned problems. This object may be achieved through the combination of features described in independent claims of the invention. Dependent claims thereof specify preferable embodiments of the invention.

According to a first aspect of the invention, there is provided a performance board for electrically connecting a device-under-test with a test apparatus that has a test head that contains test modules for sending/receiving signals to/from the device-under-test, having a plurality of sub-boards, each containing a part of a plurality of wires for connecting the test modules with the device-under-test and a fixing section for attaching and fixing the plurality of sub-boards in a body to the test head.

The fixing section may have a test head-side attachment section attached and fixed to the test head and a sub-board-side attachment section for attaching and fixing the respective sub-boards, and each of the sub-boards may have a test head-side connector provided on the back of the sub-board and electrically connected with the test module and a device-side connector provided on the surface of the sub-board and electrically connected with the device-under-test.

The fixing section may fix the plurality of sub-boards in a body in the shape of a disk, and the sub-board-side attachment section may fix the respective sub-boards at an outer peripheral portion of the disk.

The sub-board-side attachment section may fix the sub-boards also at a center part of the disk.

One of the sub-boards may be a voltage supplying board for supplying preset voltage to the plurality of sub-boards, and each one of the plurality of sub-boards except of the voltage supplying board may be disposed adjacent to the voltage supplying board and may receive the preset voltage from the voltage supplying board in a state in which the plurality of sub-boards is fixed by the fixing section.

A part of the plurality of sub-boards may be a dummy board having no wire for connecting the test module with the device-under-test.

The fixing section may further include a connecting section for electrically connecting wires on the two or more adjacent sub-boards.

According to a second aspect of the invention, there is provided a test apparatus for testing a device-under-test, having a test head containing test modules for sending/receiving signals to/from the device-under-test, a device mounting section having a socket for mounting the device-under-test and a performance board placed on the test head to connect each terminal of the test module with each terminal of the device-under-test via the device mounting section, and the performance board has a plurality of sub-boards each containing a part of a plurality of wires for connecting the test module with the device-under-test, and a fixing section for attaching and fixing the plurality of sub-boards in a body to the test head.

According to a third aspect of the invention, there is provided a test method for testing a device-under-test by means of a test apparatus that has a test head containing test modules for sending/receiving signals to/from the device-under-test, having a fixing step of fixing a plurality of sub-boards containing each part of a plurality of wires for connecting the test modules with the device-under-test to compose a performance board that connects each terminal of the test module with each terminal of the device-under-test, a performance board mounting step of mounting the performance board on the test head, a socket mounting step of mounting a device mounting section having a socket for mounting the device-under-test on the performance board, a device mounting step of mounting the device-under-test on the socket and a judging step of supplying a test signal from the test module to the device-under-test and of judging whether or not the device-under-test is defect-free based on an output signal outputted out of the device-under-test corresponding to the test signal.

The fixing step may include fixing at least a set of sub-boards used for electrically connecting one device-under-test with the test modules in a body in developing a test program for testing the device-under-test or fixing more sets of sub-boards than that used in developing the test program in a body in producing the device-under-tests in mass-production.

According to a fourth aspect of the invention, there is provided a diagnosis board electrically connected with a test apparatus for testing a device-under-test and used in diagnosing the test apparatus, wherein the test apparatus has a test head containing test modules for sending/receiving signals to/from the device-under-test, and the diagnosis board has a plurality of sub-boards connected with each part of a plurality of terminals of the test modules and used for diagnosing the connected terminals and a fixing section for attaching and fixing the plurality of sub-boards in a body to the test head.

According to a fifth aspect of the invention, there is provided a diagnosis method for diagnosing a test apparatus for testing device-under-tests, wherein the test apparatus has a test head containing test modules for sending/receiving signals to/from the device-under-test and the diagnosis method include a fixing step of fixing a plurality of sub-boards connected to each part of a plurality of terminals of the test module in a body to compose a diagnosis board, a diagnosis board mounting step of mounting the diagnosis board on the test head and a diagnosing step of diagnosing the test apparatus based on a result of signals sent/receiving between the test module and the diagnosis board.

It is noted that the summary of the invention described above does not necessarily describe all necessary features of the invention. The invention may also be a sub-combination of the features described above.

DETAILED DESCRIPTION OF THE INVENTION

The invention will now be described based on preferred embodiments, which do not intend to limit the scope of the invention, but exemplify the invention. All of the features and the combinations thereof described in the embodiments are not necessarily essential to the invention.

Figure 1:
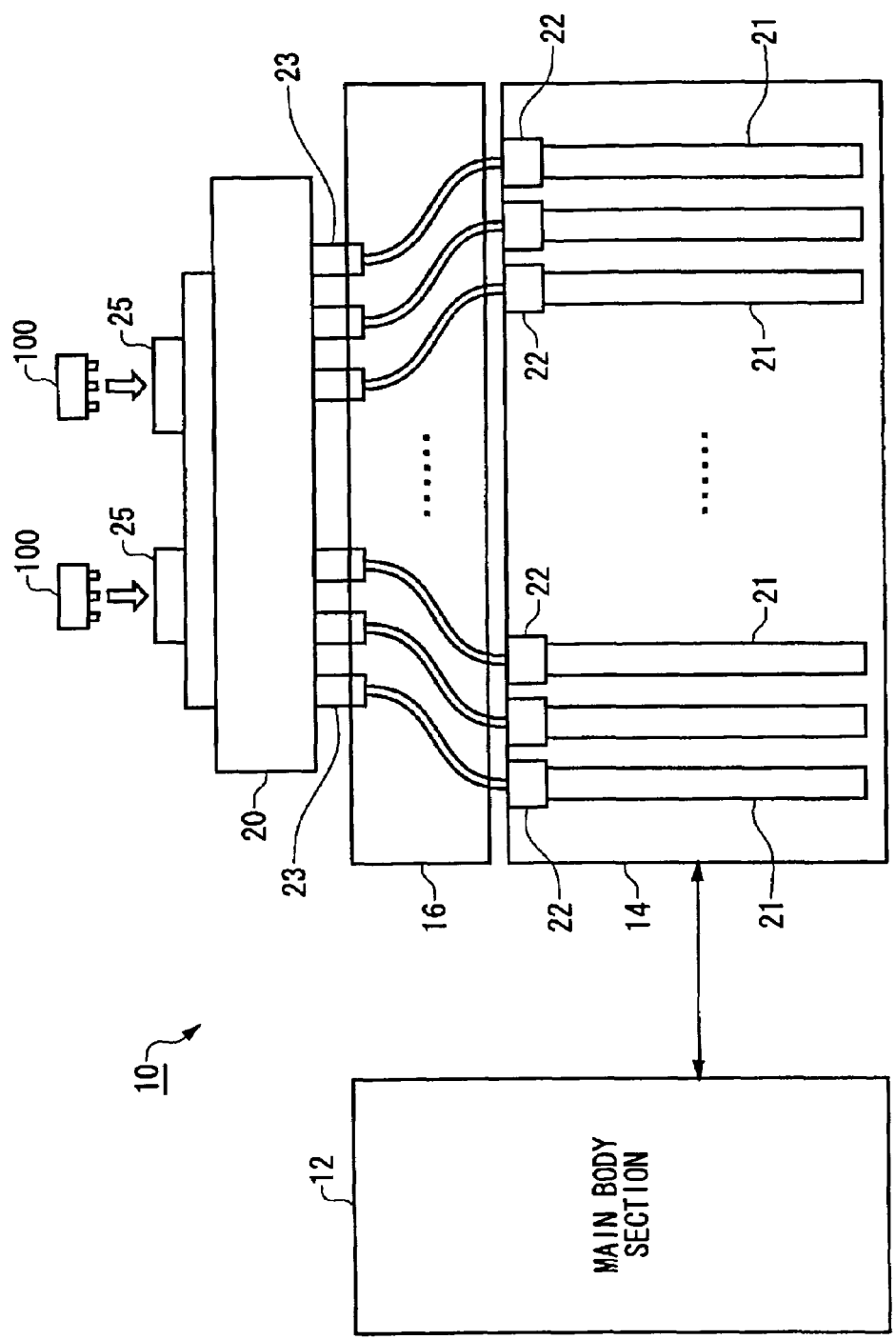
FIG. 1 shows an overall configuration of a test apparatus 10 according to one embodiment of the invention.

FIG. 1 shows an overall configuration of a test apparatus 10 according to one embodiment of the invention. The test apparatus 10 efficiently tests a device-under-test (hereinafter referred to as a DUT) 100 such as a semiconductor device.

The test apparatus 10 has a main body section 12, a test head 14 and a performance board 20.

The main body section 12 controls the whole test apparatus 10, judges whether or not the DUT 100 is defect-free and analyzes test results.

The test head 14 contains a plurality of test modules 21 for sending/receiving signals to/from the DUT 100. Each test module 21 is incorporated within the test head 14 when it is attached to the slot 22 and thereby can send/receive signals to/from the DUT 100. Each test module 21 sends a test signal to the DUT 100 and receives an output signal from the DUT 100 outputted corresponding to the test signal. Each slot 22 is made in common. Accordingly, the test modules 21 may be freely replaced or rearranged in the test head 14. The test head 14 is also provided with a test fixture 16 thereon. The test fixture 16 electrically and mechanically connects each slot 22 built in the test head 14 with the performance board 20.

The performance board 20 is formed approximately in the shape of a plate and is mounted on the test head 14 through an intermediary of the test fixture 16 in a state in which a backside of the plate faces to the test head 14. The performance board 20 has test head-side connectors 23 provided on the backside thereof for electrically connecting with the test modules 21. The performance board 20 also has DUT sockets 25 provided on the surface side thereof for mounting the DUTs 100 and electrically connecting with the DUTs 100. Thereby, the performance board 20 electrically connects the DUT 100 with the test apparatus 10 when it is mounted on the test head 14. The DUT socket 25 is one example of a device-side connecting section and a device mounting section of the invention.

Such performance board 20 properly connects the test head-side connecting section 23 with the DUT socket 25, supplies the test signal sent out of the test module 21 to a proper terminal of the DUT 100 and supplies the output signal outputted out of a terminal of the DUT 100 to a proper test module 21.

Such test apparatus 10 is capable of testing a plurality of DUTs 100 mounted on the performance board 20 in parallel and of judging whether or not those DUTs 100 are defect-free.

Figure 2:
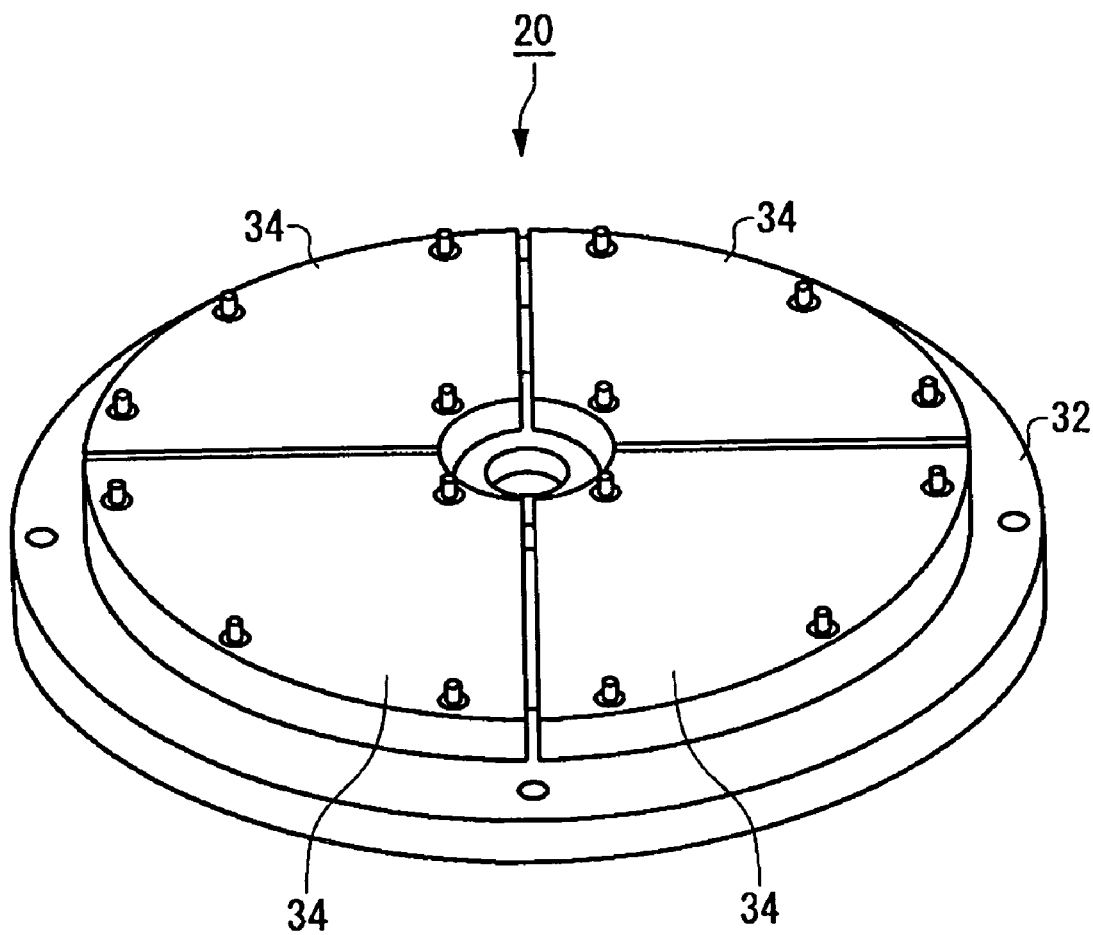
FIG. 2 is a diagrammatic perspective view of a performance board 20.

FIG. 2 is a diagrammatic perspective view of the performance board 20.

The performance board 20 has a plate-like fixing section 32 and a plurality of sub-boards 34 attached on the fixing section 32. The plurality of sub-boards 34 is fixed in a body like a disk as they are fixed on the fixing section 32.

Each sub-board 34 is provided with the DUT socket 25 on the surface side thereof and with the test head-side connecting section 23 on the backside thereof. Each sub-board 34 includes part of a plurality of wires for connecting the test modules 21 with the DUTs 100. At the time when all of the sub-boards 34 are attached to the fixing section 32, the performance board 20 is put into a state of having all of the wires for connecting the test modules 21 with the DUTs 100. Then, the performance board 20 is mounted on the test head 14 in a manner of facing the backside of the sub-boards 34 to the test head 14 while attaching and fixing the plurality of sub-boards 34 in a body to the fixing section 32.

Figure 3:
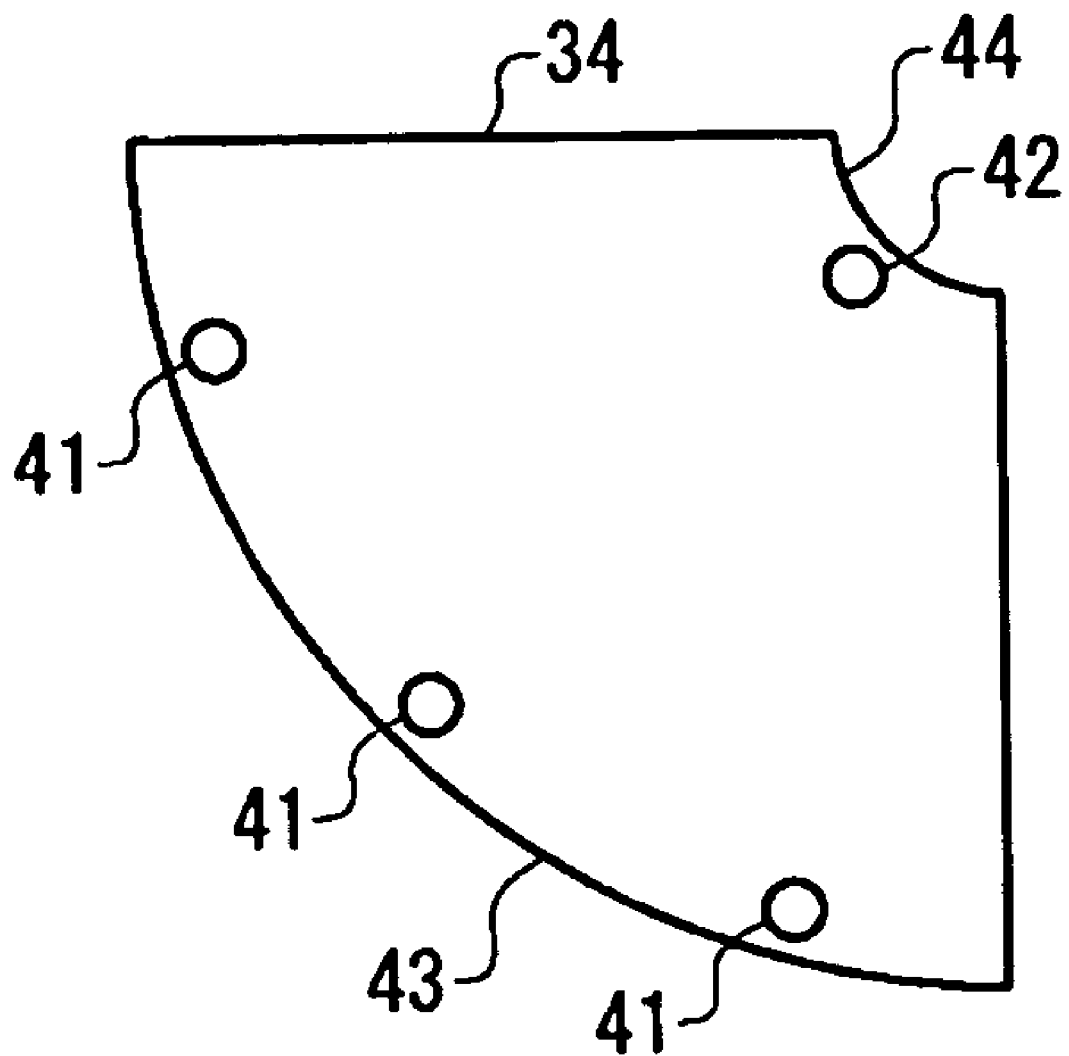
FIG. 3 is a plan view of a sub-board 34.

FIG. 3 is a plan view of the sub-board 34.

The sub-board 34 is a fan-shape plate whose center part is concentrically cut away. The sub-board 34 has outer holes 41 and an inner hole 42 that penetrate through the plate. The outer plates 41 are formed in the vicinity of an outer edge 43 forming an arc at the outer peripheral portion of the fan. The inner hole 42 is formed in the vicinity of an inner edge forming a circumference of the cut-away portion of the fan.

Figure 4:
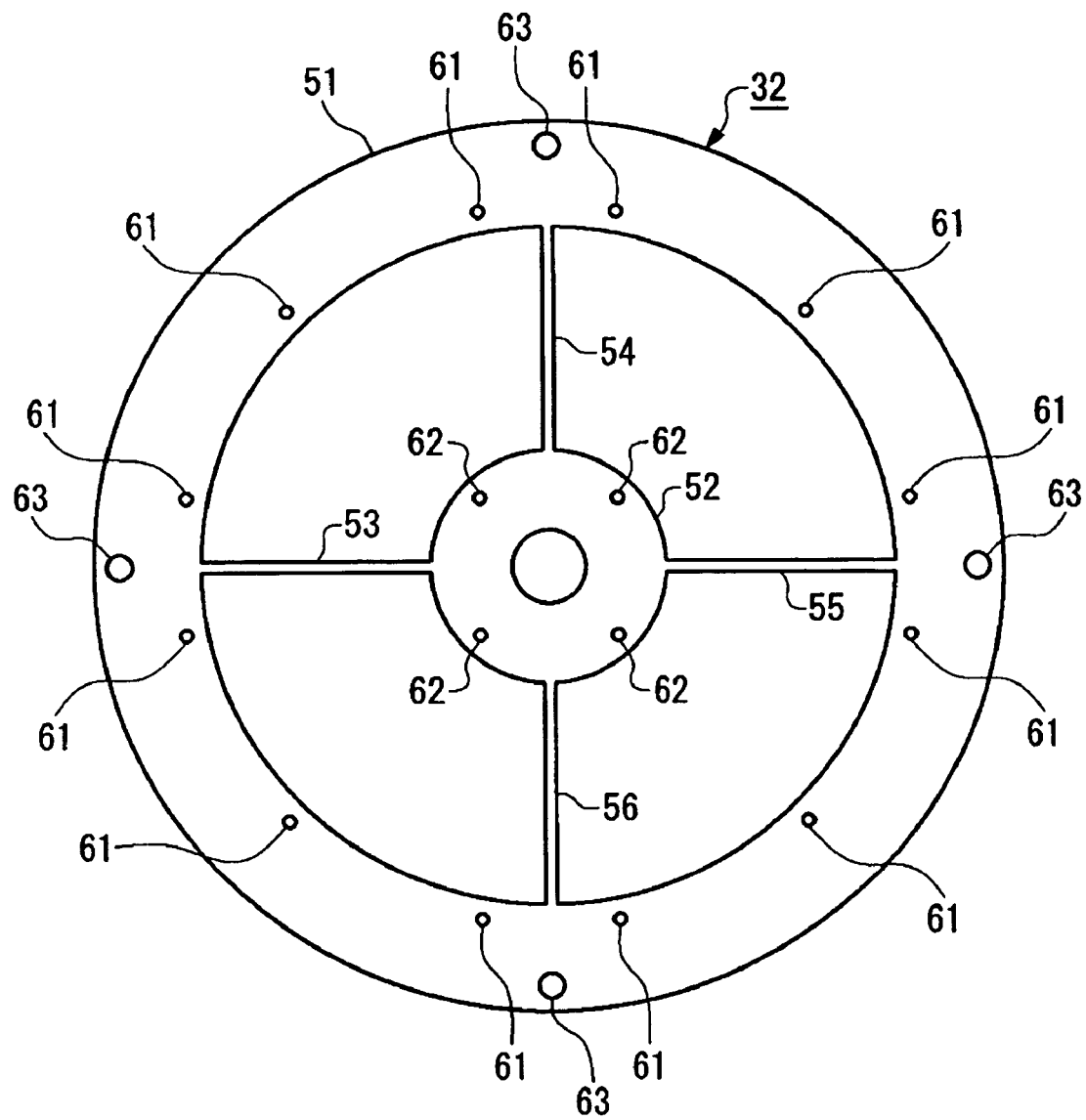
FIG. 4 is a plan view of a fixing section 32.

FIG. 4 is a plan view of the fixing section 32.

The fixing section 32 has an outer ring portion 51, an inner ring portion 52, a first bridge portion 53, a second bridge portion 54, a third bridge portion 55 and a fourth bridge portion 56 formed respectively in a body so as to have the same thickness. The fixing section 32 also has a plurality of outer pins 61, i.e., protrusions, provided in the vicinity of an inner circumference of the outer ring portion 51 on the surface thereof, a plurality of inner pins 62, i.e., protrusions, provided in the vicinity of an outer circumference of the inner ring portion 52 on the surface thereof and attachment holes 63, i.e., holes penetrating through the plate, formed in the vicinity of an inner circumference of the outer ring portion 51.

The outer ring portion 51 is formed in the shape of a ringed plate. The outer ring portion 51 has an outer circumference whose radius is larger than a radius of the fan-shaped sub-board 34 and an inner circumference whose radius is smaller than the radius of the fan-shaped sub-board 34. The inner ring portion 52 is also formed in the shape of a ringed plate. The inner ring portion 52 has an outer circumference whose radius is larger than a radius of a circumference of the cut-away portion of the fan-shaped sub-board 34 and an inner circumference whose radius is smaller than the radius of the circumference of the cut-away portion of the fan-shaped sub-board 34. The first through fourth bridge portions 53, 54, 55 and 56 bridge over the outer and inner ring portions 51 and 52 so as to concentrically dispose the outer and inner ring portions 51 and 52 and to fix such disposition.

Figure 5:
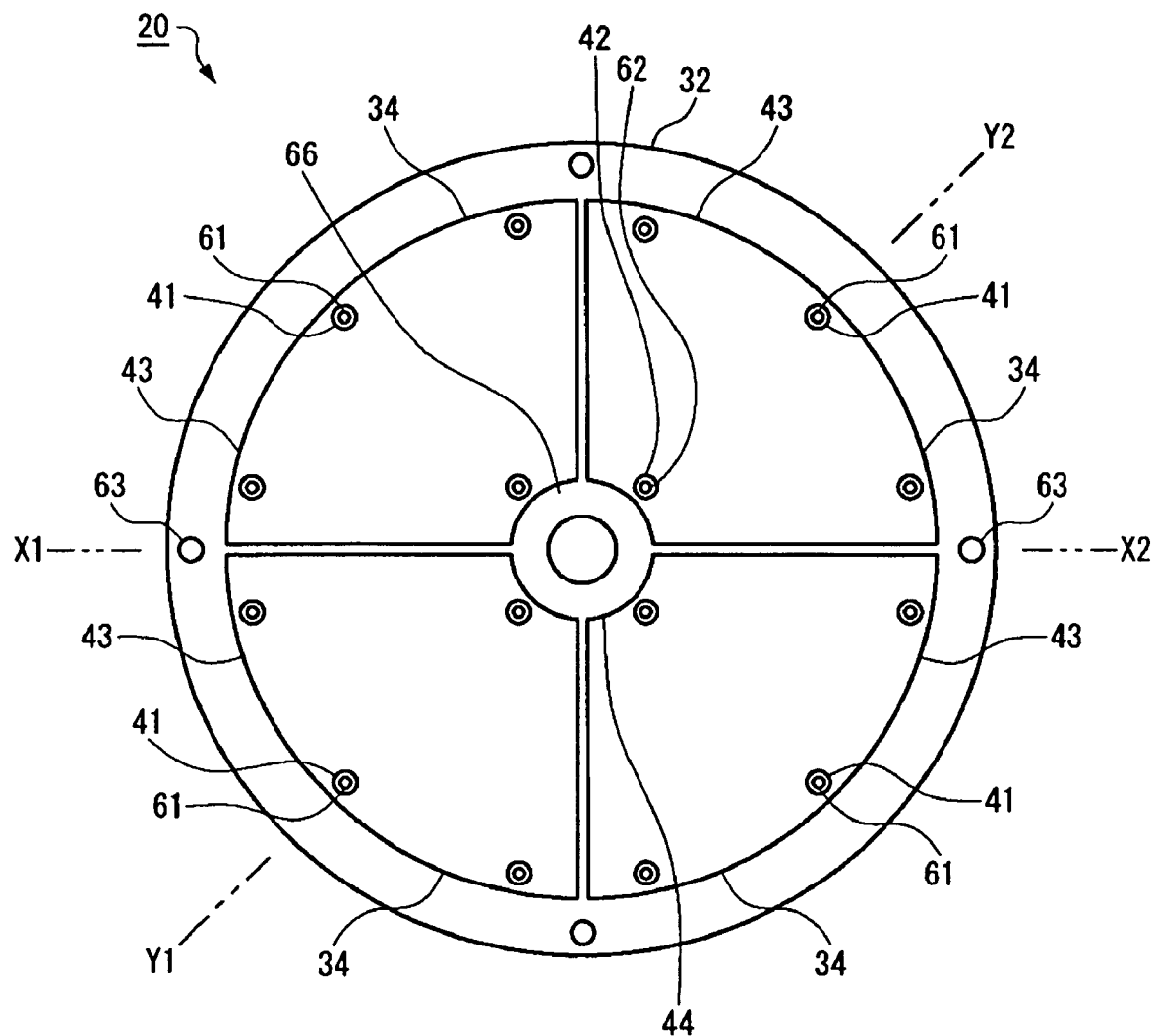
FIG. 5 is a plan view of the performance board 20 in a state in which the sub-boards 34 are attached to the fixing section 32.
Figure 6:
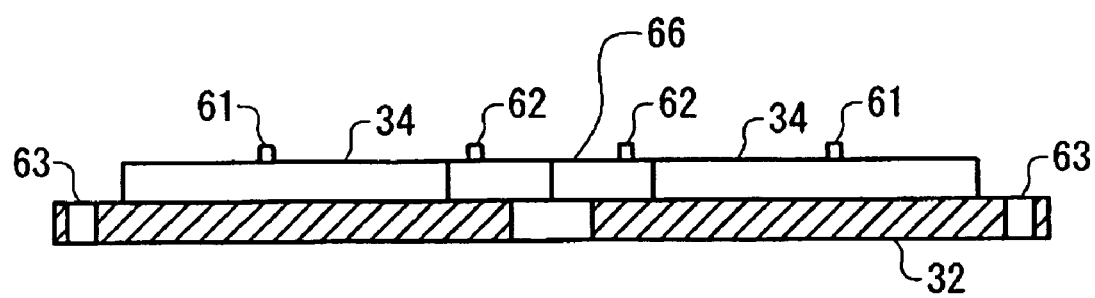
FIG. 6 is a section view along a line X1-X2 in FIG. 5.
Figure 7:
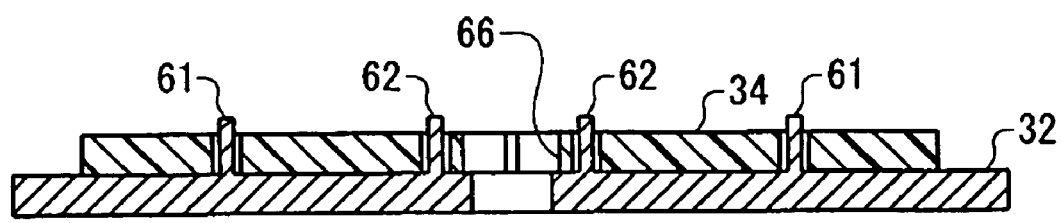
FIG. 7 is a section view along a line Y-Y2 in FIG. 5.

FIG. 5 is a plan view of the performance board 20 when the sub-boards 34 are attached to the fixing section 32. FIG. 6 is a section view along a line X1-X2 in FIG. 5 and FIG. 7 is a section view along a line Y-Y2 in FIG. 5.

The plurality (e.g., four) of sub-boards 34 is disposed on the fixing section 32 in a manner of overlapping the plates. Each sub-board 34 is disposed so that the center of the fan coincides with the center of the outer ring portion 51. As a result, the outer edge 43 of each sub-board 34 is positioned on the outer ring portion 51 and the inner edge 44 thereof is positioned on the inner ring portion 52. Each sub-board 34 is disposed so that edges forming straight-line parts of the fan face to each other. Then, when all of these sub-boards 34 are disposed on the fixing section 32, they turn out to be a disk as a whole in which a circular opening 66 is formed at the center thereof.

The outer pin 61 and the outer hole 41 are formed at the position corresponding to each other and the inner pin 62 and the inner hole 42 are also formed at the position corresponding to each other. Therefore, when each sub-board 34 is disposed on the fixing section 32, the outer pin 61 is inserted into the outer hole 41 and the inner pin 62 is inserted into the outer hole 41.

These outer and inner pins 61 and 62 and the outer and inner holes 41 and 42 function as positioning members for determining position where each sub-board 34 is attached. The outer pin 61 is one example of an inventive sub-board-side attachment section and functions as a member for fixing each sub-board 34 at the outer peripheral part of the disk. The inner pin 62 is also one example of the inventive sub-board-side attachment section and functions as a member for fixing each sub-board 34 at the center part of the disk.

It is then possible to put nuts or the like on the outer and inner pins 61 and 62 after inserting the outer and inner pins 61 and 62 into the outer and inner holes 41 and 42 and to fasten and fix the sub-board 34 to the fixing section 32.

It is also possible to form screw holes through the fixing section 32 and to form through holes through the sub-board 34 to hold them in place by inserting bolts from the sub-board 34 side. Still more, although there is provided a gap between an outer diameter of the outer and inner holes 61 and 62 and an inner diameter of the outer and inner holes 41 and 42, respectively, in the figure, the pins may be inserted into the holes without such gap.

When the performance board 20 is placed on the test head 14, pins provided on the test head 14 are inserted into the attachment holes 63. It then positions the performance board 20 when the performance board 20 is placed on the test head 14 and fixes the performance board 20 to the test head 14. That is, the attachment hole 63 is a member by which the performance board 20 is attached and fixed to the test head 14 and is one example of a test head-side attachment section of the invention.

When the plurality of sub-boards 34 is attached to the fixing section 32, the performance board 20 having such structure may be mounted on the test head 14 and when it is mounted on the test head 14, it can electrically connect the DUT 100 with the test apparatus 10.

Figure 8:
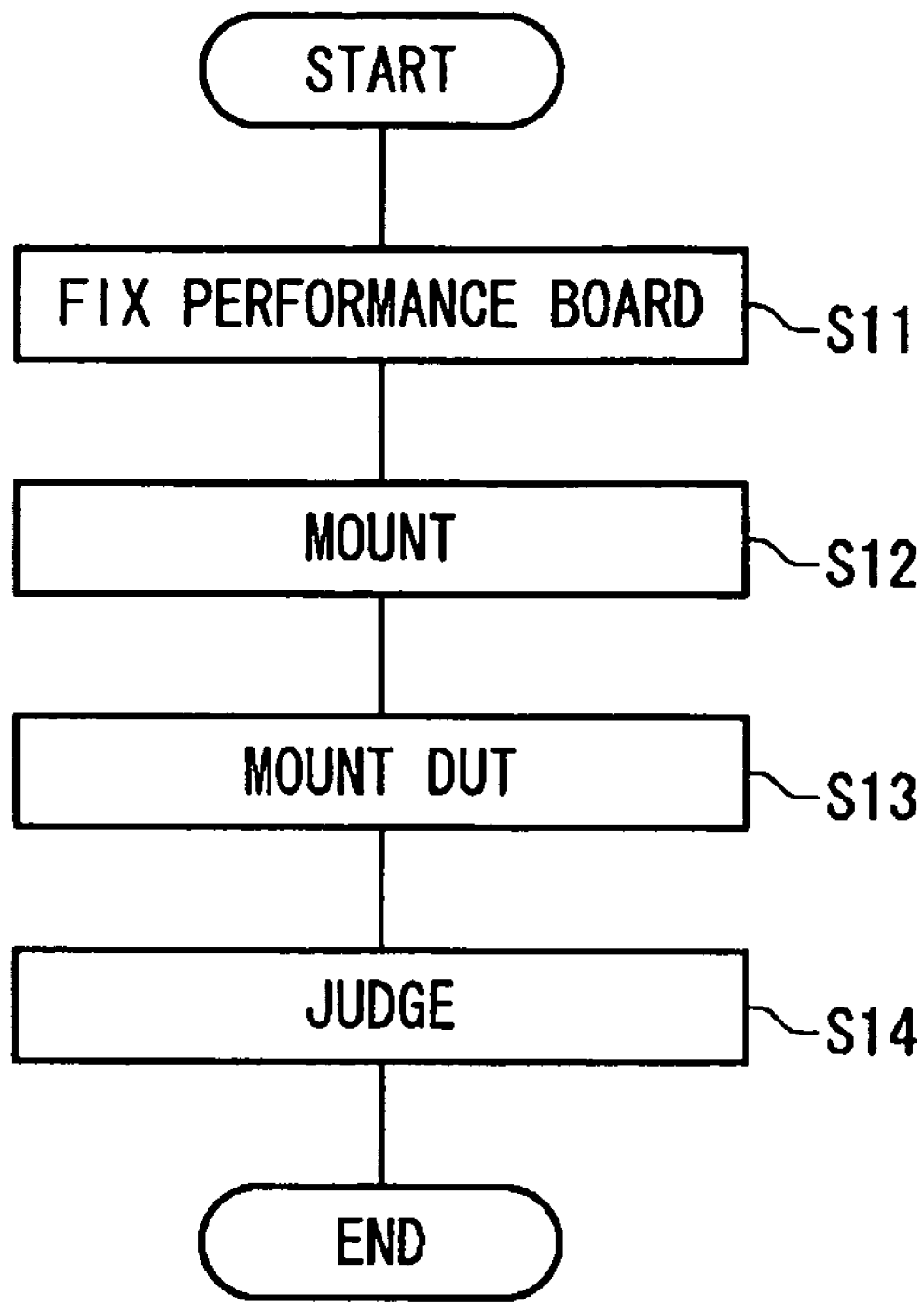
FIG. 8 is a flow chart showing testing processes of the test apparatus 10.

FIG. 8 is a flow chart shoring testing processes of the test apparatus 10.

In testing by means of the test apparatus 10, the plurality of sub-boards 34 is attached and fixed in a body to the fixing section 32 at first to compose the performance board 20 in Step S1. Next, the performance board 20 is mounted on the test head 14 in Step S12. Then, the DUT 100 is mounted on the DUT socket 25 of the performance board 20 in Step S13. Next, the test apparatus 10 supplies a test signal from the test module 21 to the DUT 100 and judges whether or not the DUT 100 is defect-free based on an output signal outputted out of the DUT 100 in correspondence to the test signal in Step S14.

The plurality of sub-boards 34 is fixed in a body on the performance board 20 described above. Therefore, it allows the performance board 20 to be composed by freely combining sub-boards 34 that have been created differently per function and type. Accordingly, this performance board 20 can accommodate even with a case when the position of the test modules 21 in the test head 14 are rearranged just by rearranging or replacing the sub-boards 34 without newly producing the board.

Figure 9:
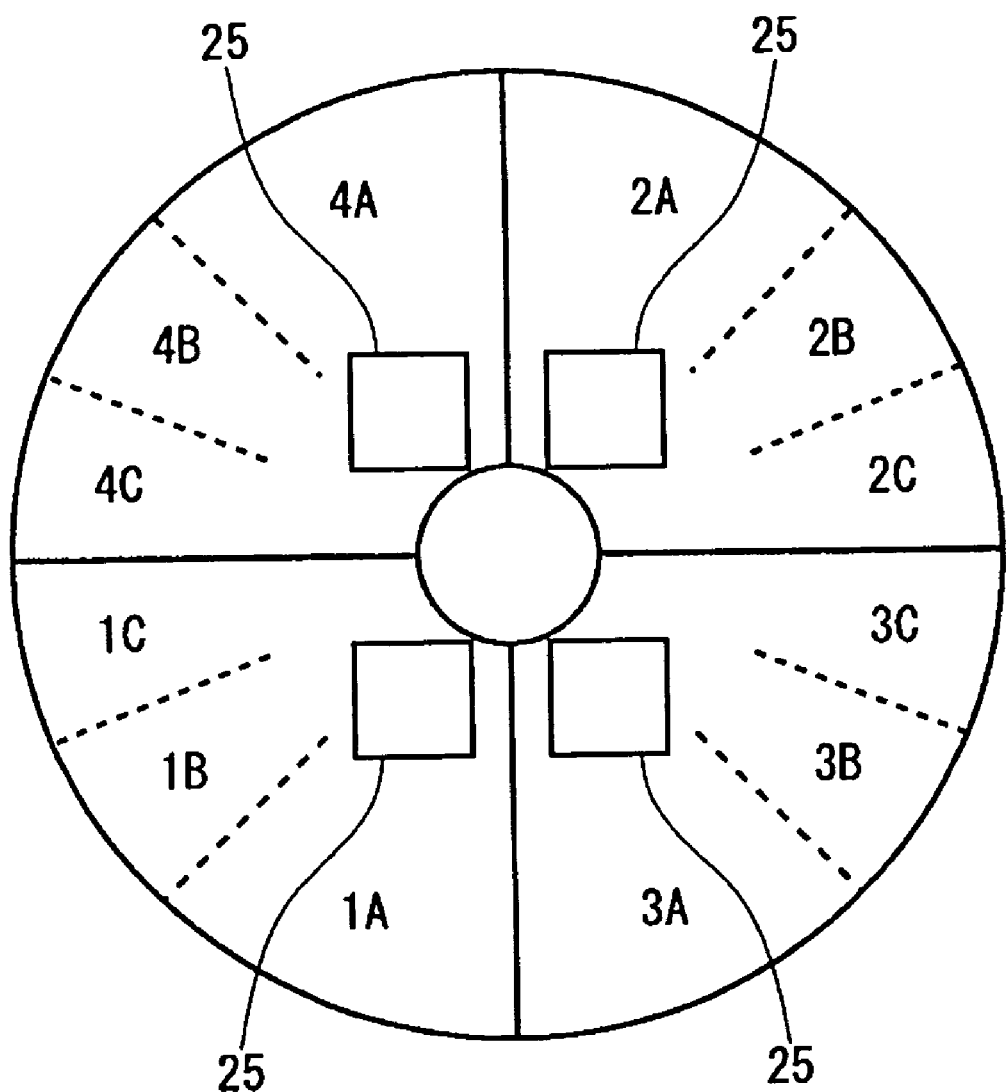
FIG. 9 shows an exemplary combination of the sub-boards 34.

FIG. 9 shows an exemplary function of the sub-boards 34 in the performance board 20 for measuring devices. The exemplary performance board shown in FIG. 9 has a structure of testing four DUTs 100 in the same time and is used in mass-production.

One sub-board 34 may have regions formed in correspondence to a plurality of test modules 21 connected to one DUT 100. For example, 1A through 4A in FIG. 9 denote regions provided with connectors and wires corresponding to the test module 21 for applying a signal to the DUT 100 or for comparing a signal from the DUT 100, 1B through 4B denote regions provided with connectors and wires corresponding to the test module 21 for supplying device power to the DUT 100 and 1C through 4C denote regions provided with connectors and wires corresponding to the test module 21 for controlling peripheral circuits or for supplying power to the peripheral circuits provided on the sub-boards 34.

One sub-board 34 may be connected with a plurality of test modules 21 necessary for testing one DUT 100.

Figure 10:
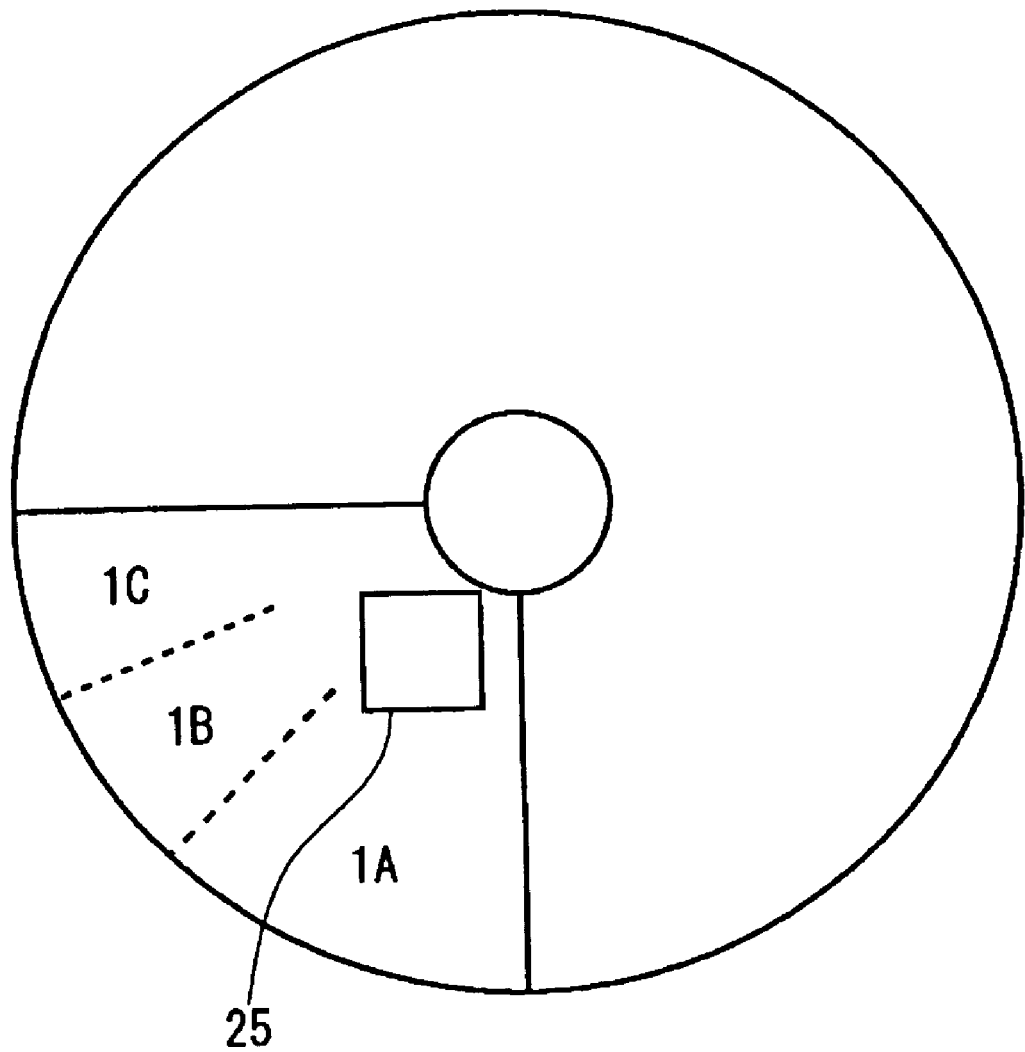
FIG. 10 shows an exemplary combination of the sub-boards 34 when used in developing a testing program.

FIG. 10 shows an exemplary attachment of the sub-board 34 used in developing a testing program or in producing a small amount of products.

When four DUTs 100 are to be mounted for example, the performance board 20 used in mass-production is composed of four sub-boards 34 as shown in FIG. 9. However, the performance board 20 is not necessary to be combined with all of the four sub-boards 34 when it is used in developing the test program of the DUT 100.

Accordingly, the test apparatus 10 may fix at least one sub-board 34 for electrically connecting one DUT 100 with the test module 21 as shown in FIG. 10 in developing the test program of the DUT 100 and may fix more sub-boards 34 than that in developing the test program as shown in FIG. 9 in producing a large number of DUTs 100.

Figure 11:
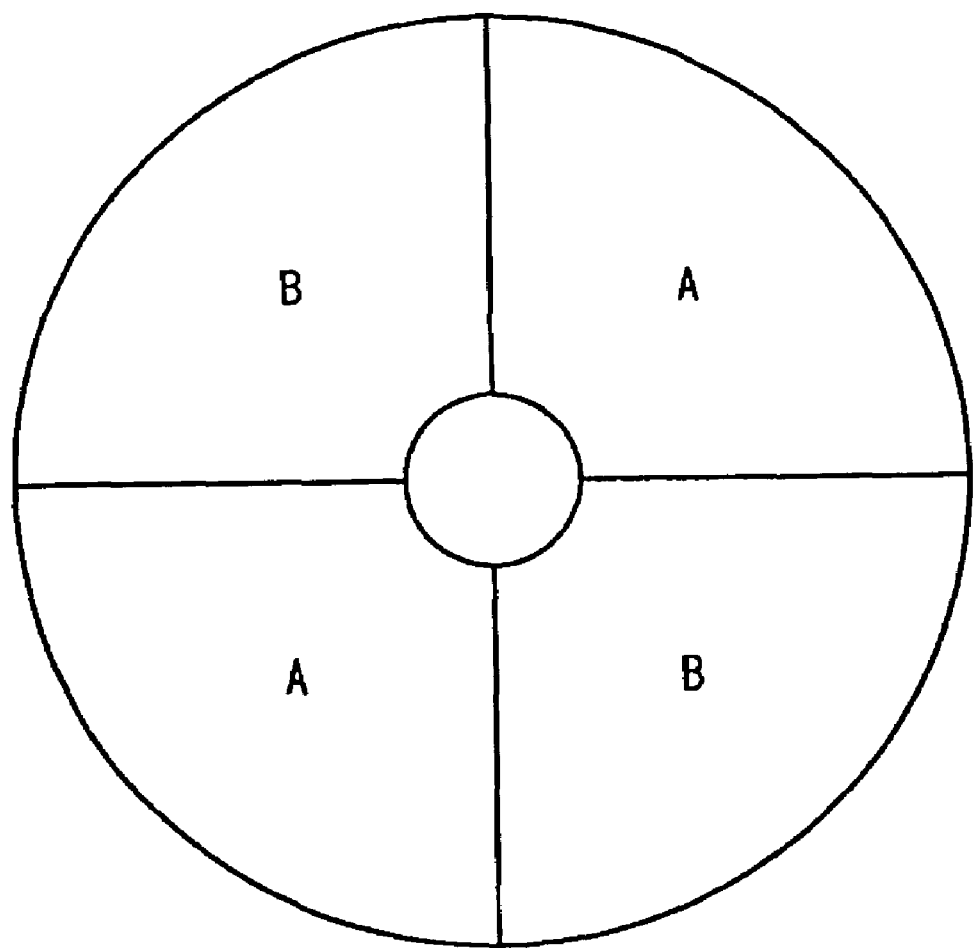
FIG. 11 shows a first exemplary combination of the sub-boards 34 in mounting two different DUTs 100 on the performance board 20.
Figure 12:
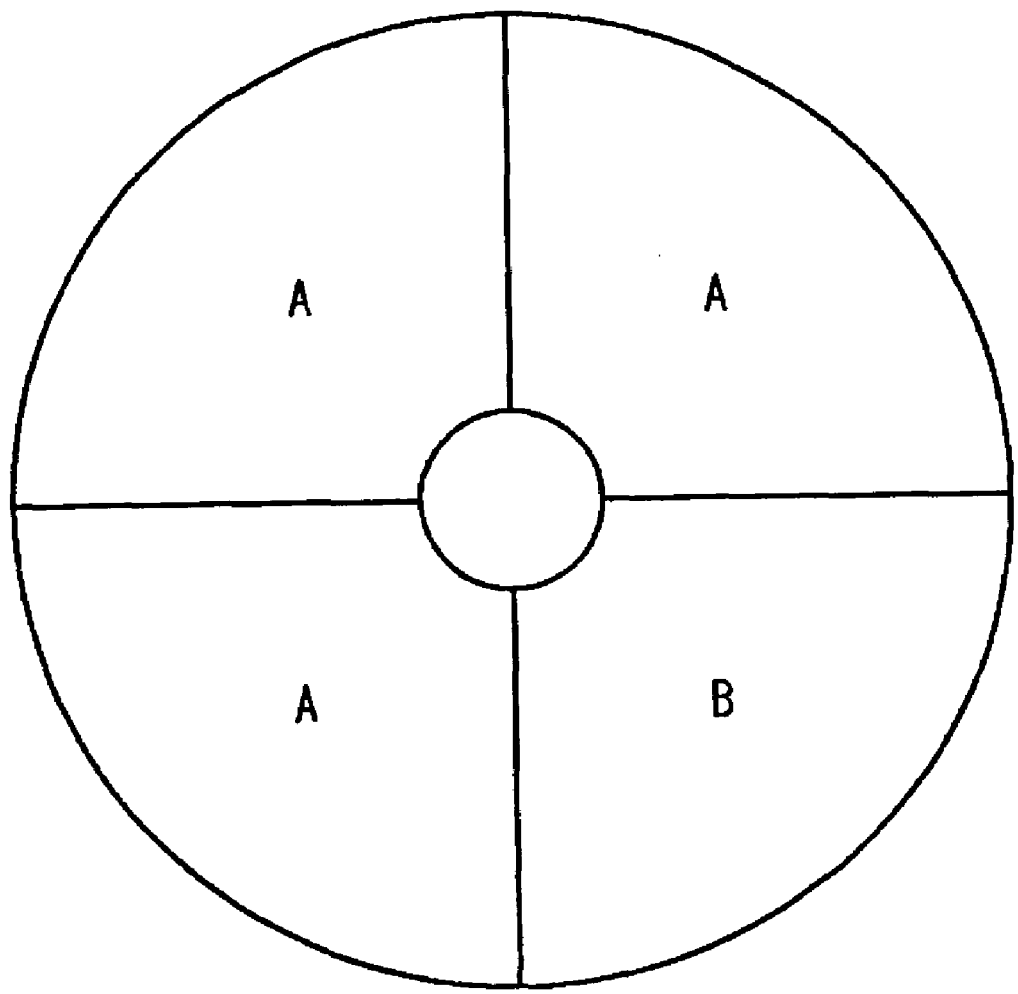
FIG. 12 shows a second exemplary combination of the sub-boards 34 in mounting two different DUTs 100 on the performance board 20.

FIG. 11 shows a first exemplary combination of the sub-boards 34 in mounting two different DUTs 100 on the performance board 20 and FIG. 12 shows a second exemplary combination of the sub-boards 34 in the same case.

In mounting the different types (A, B) of DUTs 100 on the performance board 20, the sub-boards 34 corresponding to the first type (A) and the sub-boards 34 corresponding to the second type (B) are combined for example as shown in FIG. 11 to compose one disk. The combination of the sub-boards 34 may be altered as shown in FIG. 12 corresponding to various circumstances such as a case of producing a large amount of the type (A).

The size of the plurality of sub-boards 34 fixed in a body may be also different. In case of the present embodiment in which the sub-boards are fixed in a body in the shape of a disk, it is possible to differentiate their size by differentiating a center angle of the fan.

Figure 13:
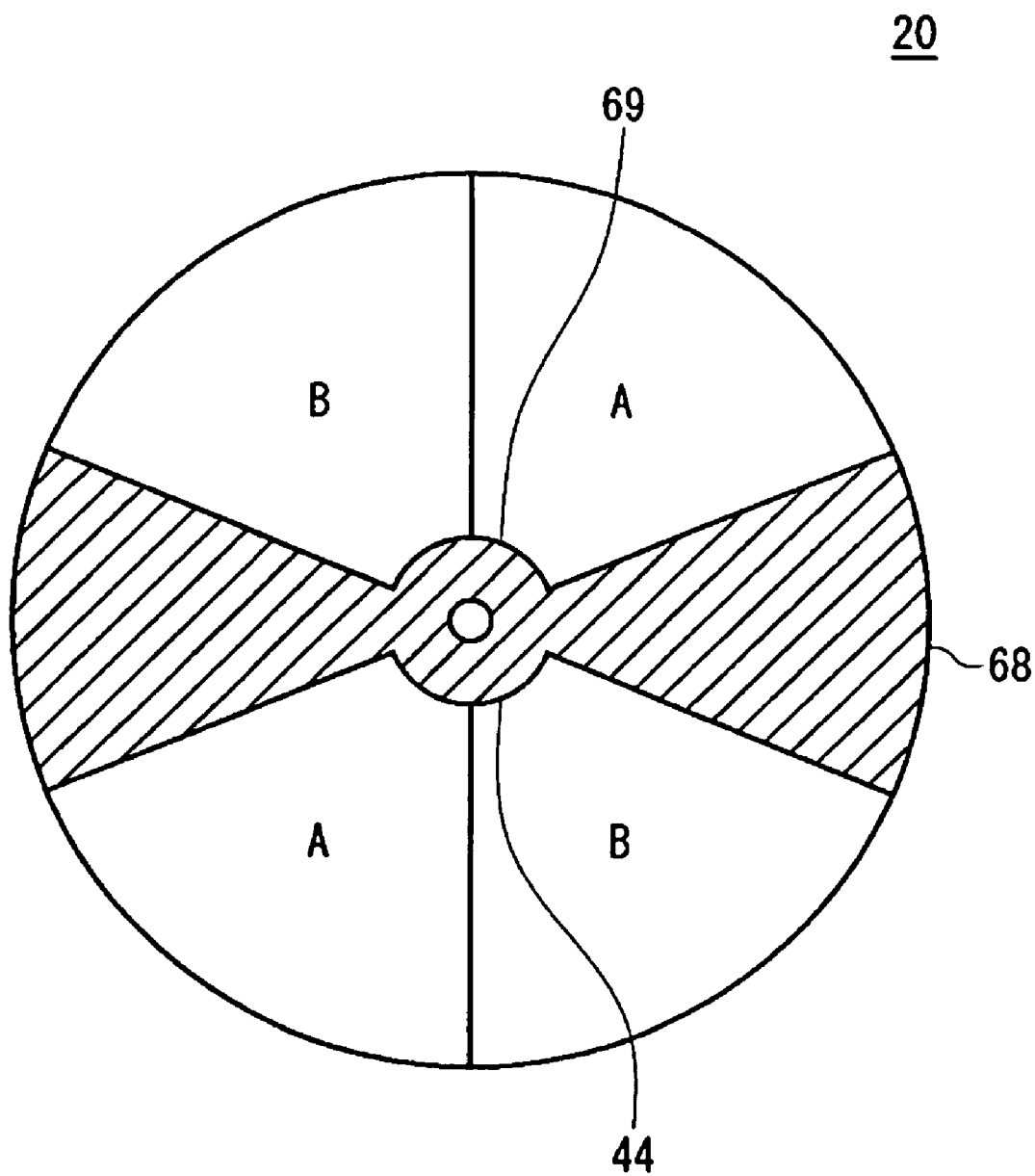
FIG. 13 shows the performance board 20 having a voltage supplying board 68.

FIG. 13 shows the performance board 20 having a voltage supplying board 68.

The performance board 20 may have the voltage supplying board 68 for supplying voltage to the device such as a relay provided on the sub-board 34 by replacing a part of the plurality of sub-boards 34.

When the plurality of sub-boards 34 and the voltage supplying board 68 are fixed by the fixing section 32, each one of the plurality of sub-boards 34 is disposed adjacent to the voltage supplying board 68 and receives preset voltage, e.g., power-supply voltage and ground voltage, from the voltage supplying board 68. In case when they are fixed in a body in the shape of the disk, the voltage supplying board 68 may have a center region 69 neighboring with the inner edge 44 of each sub-board 34 as shown in FIG. 13 for example to supply power-supply voltage and the like to the sub-boards 34 from the center region 69 through the intermediary of the inner edges 44.

Having thus the voltage supplying board 68 instead of part of the sub-boards 34 allows the sub-boards 34 to be provided with various electrical circuits thereon.

Still more, instead of part of the plurality of sub-boards 34, the performance board 20 may have a dummy board having no wire for connecting the test module 21 with the DUT 100. Providing the dummy board allows the performance board 20 to protect a connector not wired on the test head 14 side or to balance weight in mounting the performance board 20 on the test head 14.

Figure 14:
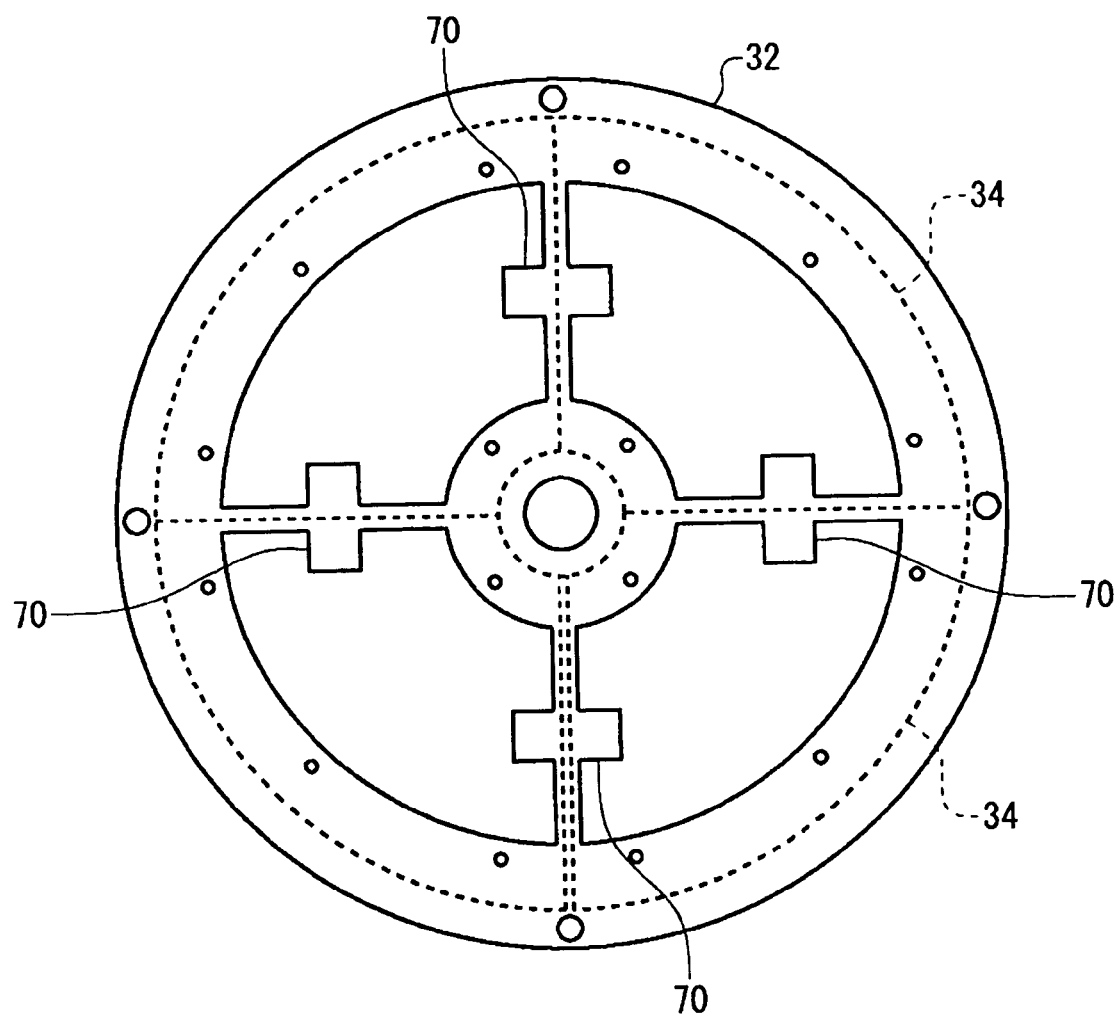
FIG. 14 is a plan view of the performance board 20 in which connecting sections 70 are provided on the fixing section 32.

FIG. 14 is a plan view of the performance board 20 having connecting sections 70 provided on the fixing section 32.

The performance board 20 may have the connecting sections 70 for electrically connecting wires on two or more neighboring sub-boards 34 on the fixing section 32. Because the connecting sections 70 allow the sub-boards 34 to be electrically connected from each other, it allows the ground voltage and power-supply voltage for example to be shared.

As described above, the performance board 20 allows the different types of sub-boards 34 having different areas and the sub-boards 34 carrying different numbers and types of connectors to be freely changed corresponding to combination of the test modules 21 or the DUTs 100.

It is noted that the performance board 20 may be formed in combination of a plurality of sub-boards 34 having a shape other than the disk, e.g., rectangle, and may have a shape of a plate other than the disk as a whole.

Figure 15:
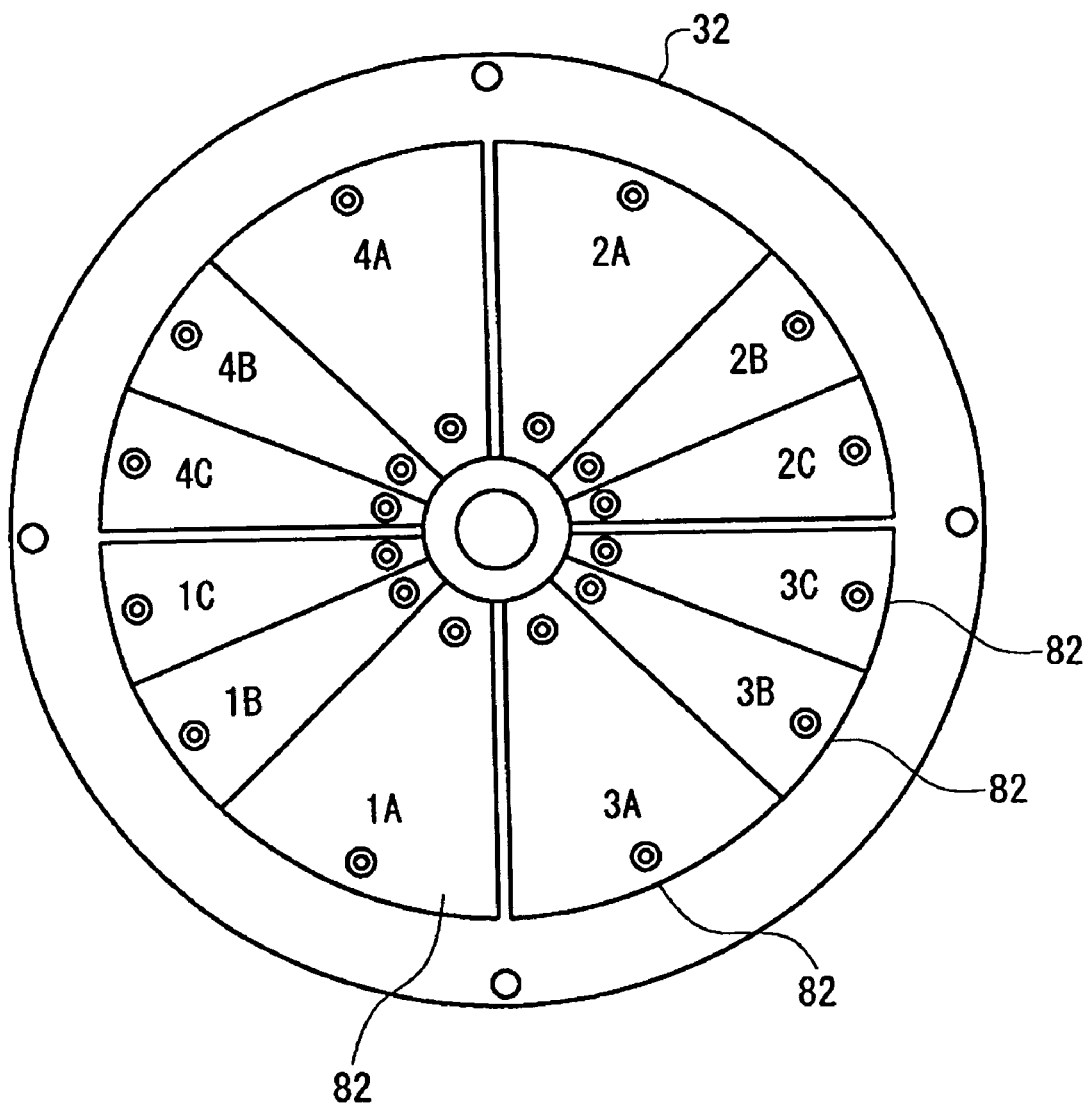
FIG. 15 is a plan view of a diagnosis board 80.

FIG. 15 is a plan view of a diagnostic sub-board 82.

The diagnosis board 80 is electrically connected with the test apparatus 10 for testing the DUT 100 and is used for diagnosing the test apparatus 10. The diagnosis board 80 is a performance board used for diagnosis, instead of the testing performance board 20. Specifically, the diagnosis board 80 is electrically connected with the test head 14 as it is mounted on the test head 14 and is used for diagnosis whether or not the test modules 21 and others normally operate.

The diagnosis board 80 has a fixing section 32 and diagnostic sub-boards 82 attached on the fixing section 32. An overall shape of the diagnostic sub-boards 82 is the same with the sub-boards 34. The diagnostic sub-board 82 is provided with electrical circuits and wires for the diagnosis. When all of the diagnostic sub-boards 82 are attached to the fixing section 32, the diagnosis board 80 is connected with each part of a plurality of terminals of the test modules 21 and is able to diagnose the connected terminals.

When regions corresponding to a plurality of test modules 21 are divisionally formed in one sub-board 34, the corresponding sub-boards 82 may be separately provided per each region. For example, when one sub-board 34 is divided into the regions corresponding to the respective test modules 21 such that A is used for application and comparison of test signals, B is used for supplying power to the device and C is used for controlling and feeding power to peripheral circuits as shown in FIG. 9, three diagnostic sub-boards 82 corresponding per each region may be formed as shown in FIG. 15. It allows the diagnostic sub-board 82 to be formed per each test module 21, the diagnosis boards to be freely rearranged or replaced and then the cost to be lowered.

Figure 16:
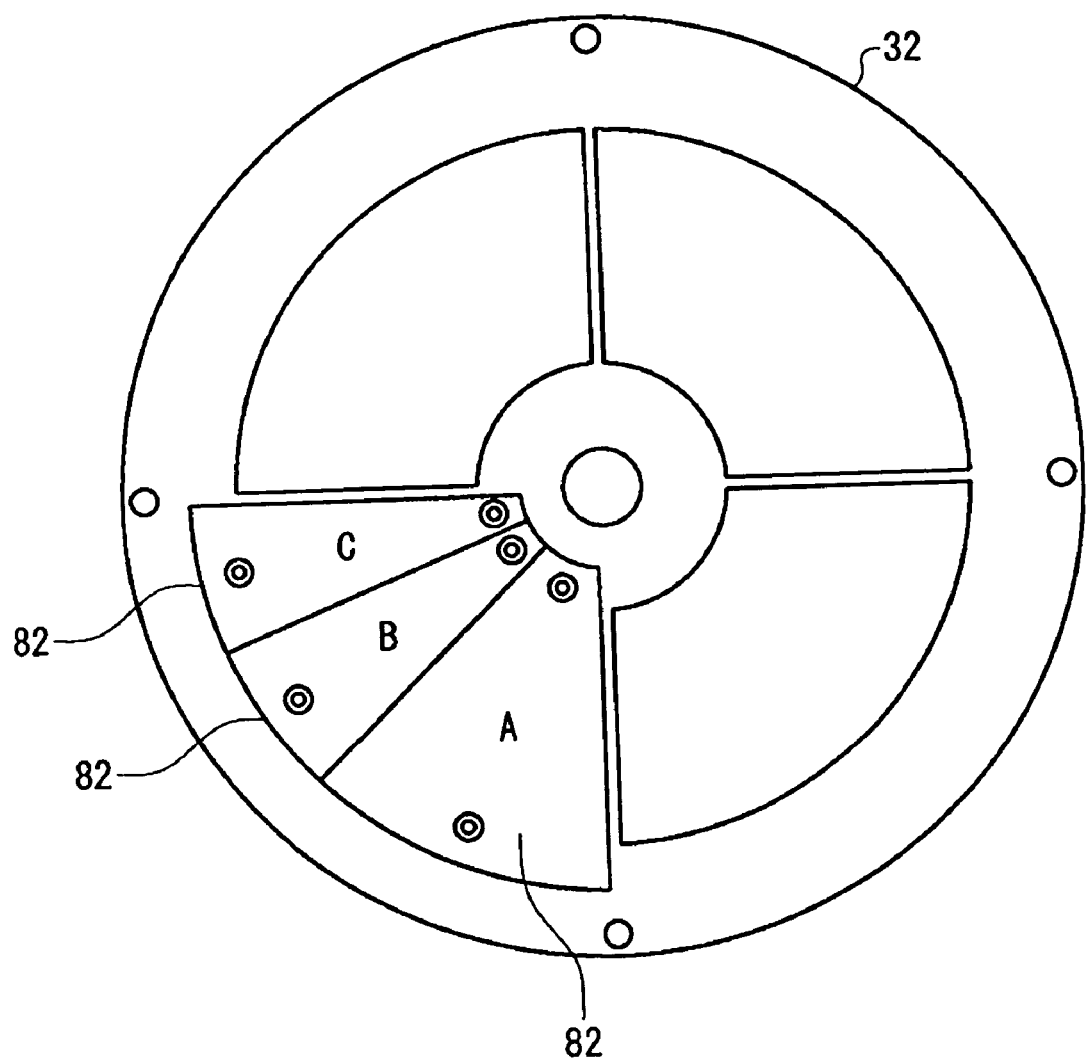
FIG. 16 shows a configuration of diagnostic sub-boards 82 in diagnosing a part of the test modules 21.

FIG. 16 shows a configuration of diagnostic sub-boards 82 in diagnosing a part of the test modules 21 when only a part of the test modules 21 is provided in the test head 14 in producing a small amount of products for example. When the diagnosis is to be made only to the part of the test modules 21, the diagnosis board 80 is required to attach only a necessary number of diagnostic sub-boards 82 and is not required to be a disk as shown in FIG. 16.

Figure 17:
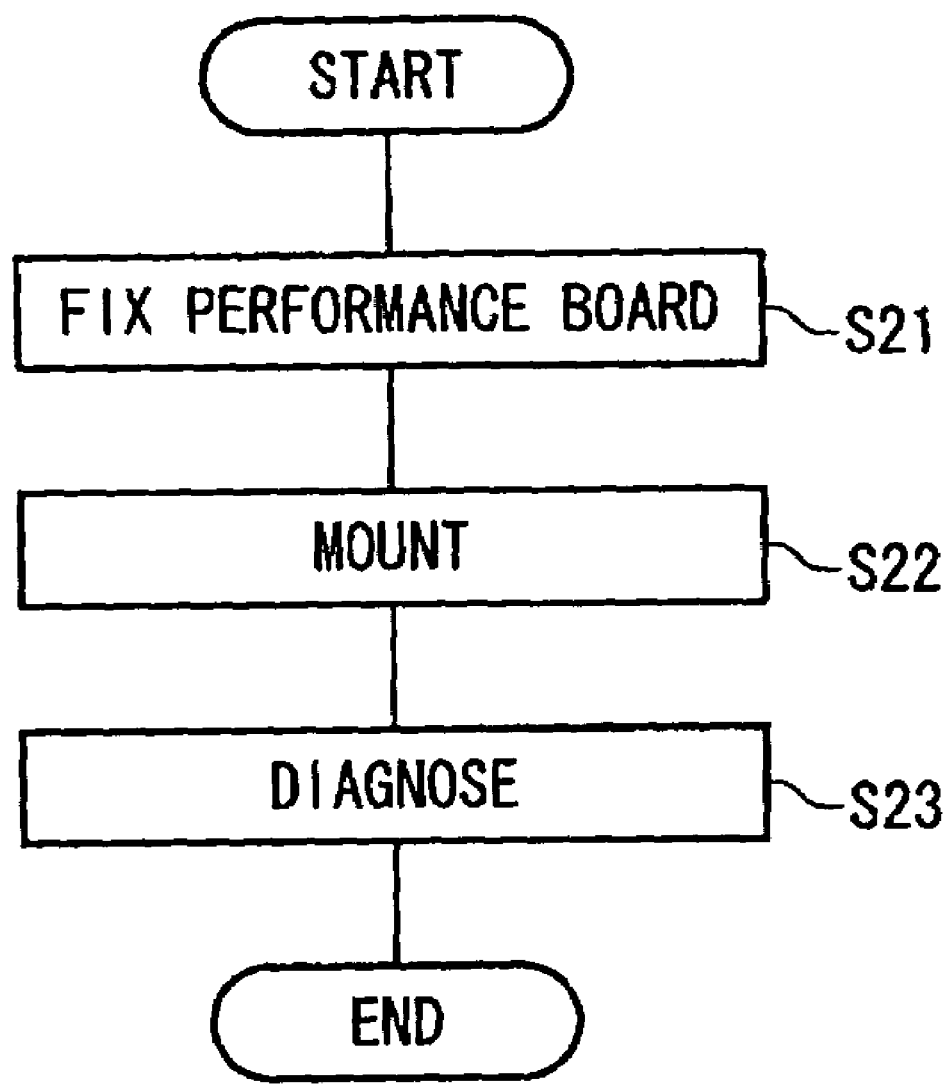
FIG. 17 shows a flow of processes for diagnosing the test apparatus 10.

FIG. 17 shows a flow of processes in diagnosing the test apparatus 10.

In diagnosing the test apparatus 10, the sub-boards 82 are attached on the fixing section 32 and are fixed in a body to compose the diagnosis board 80 in Step S21. Next, the diagnosis board 80 is placed on the test head 14 in Step S22. Then, the diagnosis board 80 diagnoses the test apparatus 10 based on results of signals sent/received between the test module 21 and the diagnosis board 80 in Step S23.

The diagnosis board 80 described above can diagnose if at least one diagnosis circuit corresponding to the DUT 100 is built, so that the size of the diagnostic sub-board 82 is not necessary to have the same size with the performance board 20. Accordingly, the diagnosis board 80 allows an excess space to be cut.

Although the invention has been described by way of the exemplary embodiments, it should be understood that those skilled in the art might make many changes and substitutions without departing from the spirit and scope of the invention.

It is obvious from the definition of the appended claims that the embodiments with such modifications also belong to the scope of the invention.

As it is apparent from the above description, the invention can realize the performance board, the test apparatus and the test method for efficiently testing device-under-tests. Still more, the invention can realize the diagnosis board and the diagnosis method for efficiently diagnosing the test apparatus.

What is claimed is:

1. A performance board for electrically connecting a device-under-test with a test apparatus, wherein
    said test apparatus has a test head containing test modules for sending/receiving signals to/from said device-under-test,
    said performance board comprises:
        a plurality of sub-boards arranged substantially on the same plane, each containing a part of a plurality of wires for connecting said test modules with said device-under-test; and
        a fixing section for attaching and fixing said plurality of sub-boards as a unit to said test head,
        said fixing section comprising:
            a test head-side attachment section attached, fixed, to said test head, and configured to allow for free replacement and rearrangement of the test modules; and
            a sub-board-side attachment section for attaching and fixing said respective sub-boards, and
        each of said sub-boards comprising:
            a test head-side connector provided on the back of said sub-board and electrically connected with said test module; and
            a device-side connector provided on the surface side of said sub-board and electrically connected with said device-under-test, and
    said sub-board-side attachment section fixes said respective sub-boards at an outer peripheral portion of said fixing section.

2. The performance board as set forth in claim 1, wherein said sub-board-side attachment section fixes said sub-boards also at a center part of said fixing section.

3. The performance board as set forth in claim 1, wherein
    one of said sub-boards is a voltage supplying board for supplying preset voltage to said plurality of sub-boards; and
    each one of said plurality of sub-boards except said voltage supplying board is disposed adjacent to said voltage supplying board and receives said preset voltage from said voltage supplying board in a state in which said plurality of sub-boards is fixed by said fixing section.

4. The performance board as set forth in claim 1, wherein a part of said plurality of sub-boards is a dummy board having no wire for connecting said test module with said device-under-test.

5. The performance board as set forth in claim 1, wherein said fixing section further includes a connecting section for electrically connecting wires on said two or more adjacent sub-boards.

6. The performance board as set forth in claim 1, wherein said fixing section fixes said plurality of sub-boards in the shape of a disk.

7. A test apparatus for testing a device-under-test, comprising:
    a test head containing test modules for sending/receiving signals to/from said device-under-test;
    a device mounting section having a socket for mounting said device-under-test; and
    a performance board placed on said test head to connect each terminal of said test module with each terminal of said device-under-test via said device mounting section,
    wherein said performance board comprises:
        a plurality of sub-boards arranged substantially on the same plane, each containing a part of a plurality of wires for connecting said test module with said device-under-test; and
        a fixing section for attaching and fixing said plurality of sub-boards as a unit to said test head,
        said fixing section comprising:
            a test head-side attachment section attached, fixed, to said test head, and configured to allow for free replacement and rearrangement of the test modules; and
            a sub-board-side attachment section for attaching and fixing said respective sub-boards, and
        each of said sub-boards comprising:
            a test head-side connector provided on the back of said sub-board and electrically connected with said test module; and
            a device-side connector provided on the surface side of said sub-board and electrically connected with said device-under-test, and
    said sub-board-side attachment section fixes said respective sub-boards at an outer peripheral portion of said fixing section.

8. The test apparatus as set forth in claim 7, wherein said fixing section fixes said plurality of sub-boards in the shape of a disk.

* * * * *